(12) United States Patent
Hotaka

(10) Patent No.: US 6,442,083 B2
(45) Date of Patent: Aug. 27, 2002

(54) REDUNDANCY MEMORY CIRCUIT

(75) Inventor: Kazuo Hotaka, Saitama (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 09/892,935

(22) Filed: Jun. 27, 2001

(30) Foreign Application Priority Data

Jun. 29, 2000 (JP) .......................................... 2000-196429

(51) Int. Cl.$^7$ ................................................ G11C 7/00

(52) U.S. Cl. .......................................... 365/200; 365/63

(58) Field of Search ............................. 365/200, 51, 63

(56) References Cited

U.S. PATENT DOCUMENTS 5,983,358 A * 11/1999 Horiguchi et al. ............. 714/6
6,201,728 B1 * 3/2002 Narui et al. ................. 365/149

* cited by examiner

Primary Examiner—Vu A. Le
(74) Attorney, Agent, or Firm—Fish & Richardson, P.C.

(57) ABSTRACT

A memory mat including EEPROM memory has a redundancy memory area for replacing a defective memory area occurring in a main memory area. The most feature of the invention is that a redundancy address memory area for storing address data of the defective memory area is provided in a part of an inforow memory area within the memory mat. The inforow memory area is constructed accessibly only at the time of a test mode.

5 Claims, 3 Drawing Sheets

REDUNDANCY MEMORY CIRCUIT

BACKGROUND OF THE INVENTION

The present invention relates to a redundancy memory circuit, and more particularly to a redundancy memory circuit for writing address data of a defective memory area into nonvolatile memory capable of electrically writing and reading, and reading out this address data and making repairs on the defective memory area (relief of defective memory).

A redundancy memory circuit has been used in many memory circuits such as DRAM, EEPROM for the purpose of repairing defective bits of a bulk memory device. In memory (EEPROM) capable of electrically writing, reading and erasing, repairs were electrically made by writing and reading a redundancy address using a part of the EEPROM.

FIG. 4 is a schematic diagram showing a configuration of a conventional redundancy memory circuit applied to EEPROM. A memory mat 50 including plural EEPROM memories capable of electrically writing, reading and erasing is constructed of a main memory area 51, a redundancy memory area 52 for replacing a defective memory area occurring in the main memory area, and an inforow memory area 53 for storing various manufacturing information. Here, the redundancy memory area 52 and the inforow memory area 53 are provided in address space separate from the main memory area 51.

Also, numeral 54 denotes a first address decoder for accessing the main memory area 51 based on address data, and numeral 55 denotes a second address decoder for accessing the redundancy memory area 52 based on redundancy address data. Then, numeral 56 denotes redundancy address memory for writing and storing address data of a memory area in which a defect occurs, and was provided as dedicated memory in an area physically distant from the memory mat 50 described above.

Summarizing operations of the redundancy memory circuit with the configuration described above, address data inputted from the outside is compared with address data of a defective memory area stored in the redundancy address memory 56 by a comparison circuit (not shown) and when both the data match, a word line selection output of the first address decoder 54 is inhibited (access to the defective memory area is inhibited) At the same time, a word line selection output of the second address decoder 55 became enabled and the redundancy memory area 52 is accessed and thereby, the defective memory area is repaired.

However, the redundancy address memory 56 was provided in an area physically distant from the memory mat 50 on a chip, so that there was the need to dedicatedly provide an analog control circuit such as an analog bias circuit used in data writing and there was a problem that a circuit scale becomes large.

Also, in the case of desiring to change a size of the redundancy memory area in some type of machine, a size of the redundancy address memory 56 must also be changed accordingly, but a change in a layout of a chip is as difficult since the redundancy address memory 56 is provided in an area physically distant from the memory mat 50. For example, in the case of changing a size of the redundancy address memory 56 to ½ (for example, a change from support for 4 sectors to support for 2 sectors), there is a problem that a useless free area occurs and a chip size becomes large.

SUMMARY OF THE INVENTION

Therefore, an object of the invention is to eliminate the need to dedicatedly provide a control circuit such as an analog bias circuit and reduce a circuit scale by forming redundancy address memory within the same memory mat as a main memory area or facilitate expansion and reduction of the redundancy address memory to reduce a chip size.

A redundancy memory circuit of the invention is characterized by comprising a main memory area including of plural nonvolatile memories capable of electrically writing and reading, means for writing redundancy address data corresponding to a defective memory area occurring in the main memory area in to a redundancy address memory area provided within the same memory mat as the main memory area, and means for reading the redundancy address data, characterized in that the defective memory area is repaired on the basis of the redundancy address data read from the redundancy address memory area.

In accordance with such means, the redundancy address memory area is formed within the same memory mat as the main memory area, so that the need to dedicatedly provide a dedicated EEPROM cell for storing redundancy address data and an analog control circuit for writing the redundancy address data into this EEPROM cell is eliminated and a chip size can be reduced.

Also, a size of the redundancy address memory area can be changed easily, so that memory design according to specifications of a type of machine can be performed in a short time while the chip size can be reduced.

DETAILED DESCRIPTION OF THE PREFERRED EMBODIMENT

Figure 1:
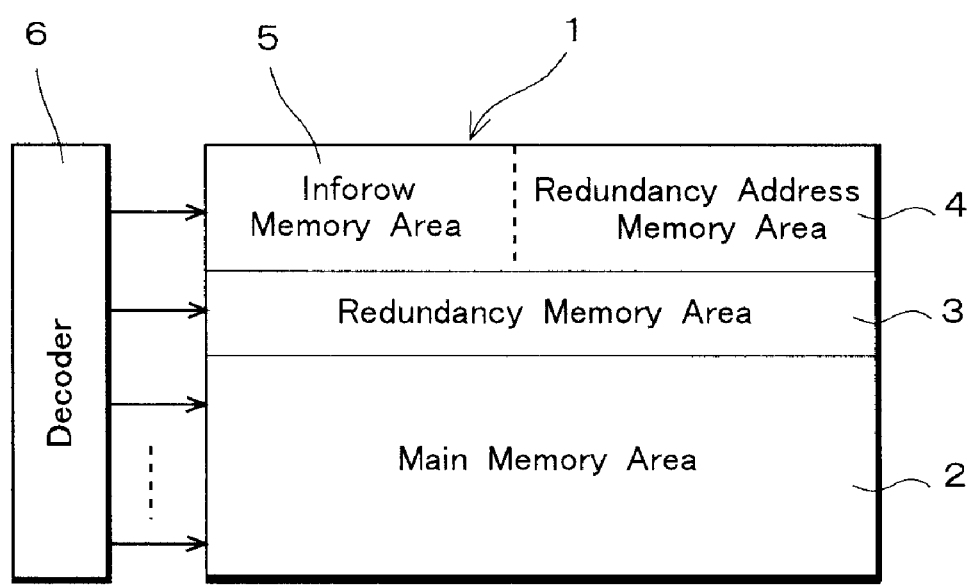
FIG. 1 is a schematic diagram showing a redundancy memory circuit according to an embodiment of the invention.

An embodiment of the invention will be described below with reference to the accompanying drawings. FIG. 1 is a schematic diagram showing a redundancy memory circuit according to an embodiment of the invention.

A memory mat 1 including plural EEPROM memories capable of electrically writing, reading and erasing has a redundancy memory area 3 for replacing a defective memory area occurring in a main memory area 2. The most feature of the invention is that a redundancy address memory area 4 for storing address data of the defective memory area is provided in a part of an inforow memory area 5 within the memory mat 1. The inforow memory area 6 is a memory area for a specified row selected by the address decoder 7, and stores various manufacturing information. The inforow memory area 5 is constructed accessibly only at the time of a test mode.

Also, the redundancy memory area 3 is provided in the same address space as the main memory area 2, and is accessed by one address decoder 6. However, this is one example, and the redundancy memory area 3 may be provided in address space separate from the main memory area 2.

Figure 2:
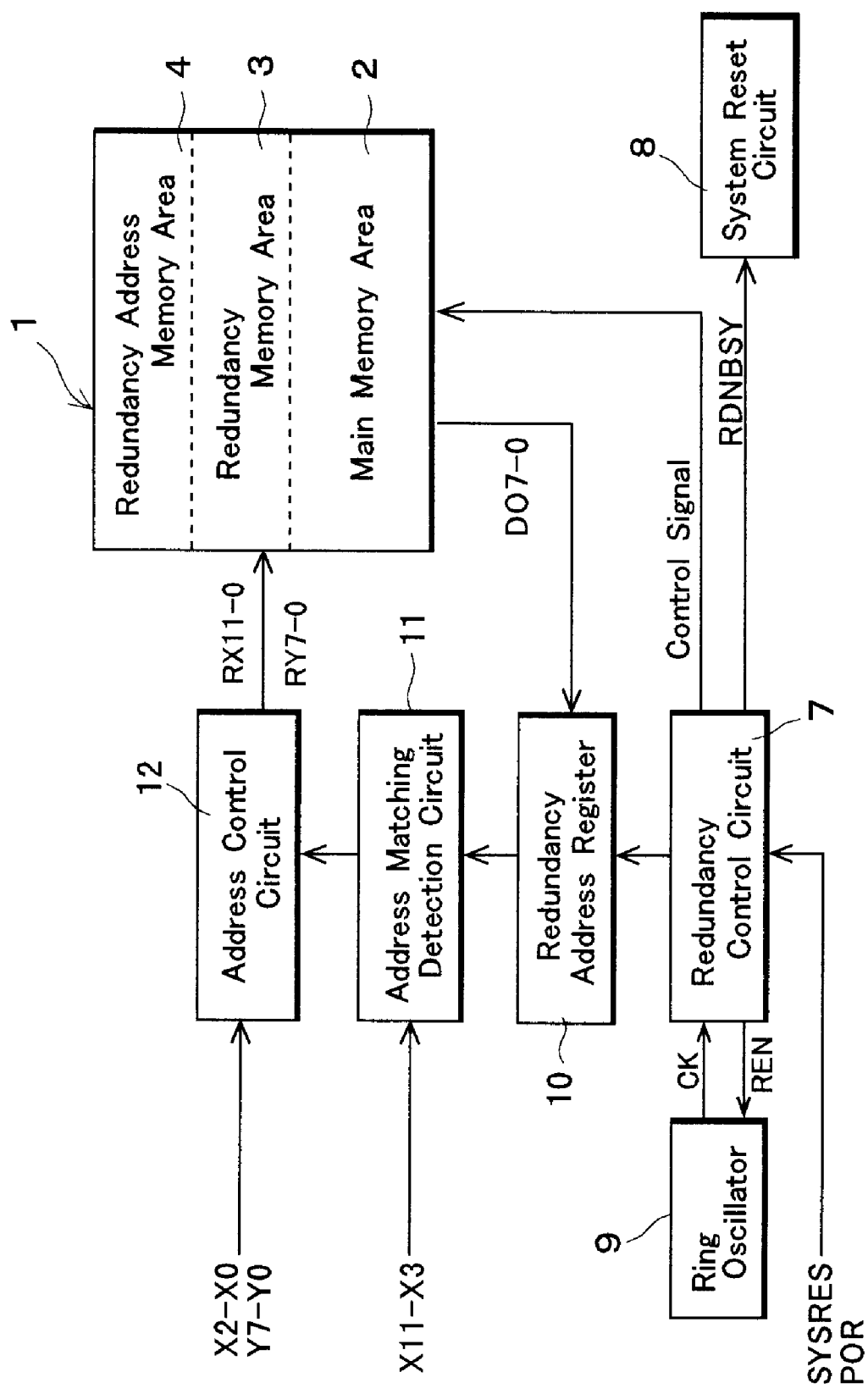
FIG. 2 is a block circuit diagram showing the redundancy memory circuit according to the embodiment of the invention.

FIG. 2 is a block diagram showing the entire configuration of the redundancy memory circuit of the embodiment. The main memory area 2 has construction of 5M bits as one example. The main memory area 2 is constructed of plural sectors of 320 sectors (1 sector=2K bytes). The redundancy memory area 3 is constructed of, for example, 4 sectors. One sector is specified by, for example, word lines extending in a row direction of the memory mat 1 and also is constructed of a memory cell group arranged in a row direction.

That is, defective sectors with 4 sectors at the maximum of the main memory area 2 can be replaced with the redundancy memory area 3 and be repaired. The main memory area 2 and the redundancy memory area 3 are an area used as, for example, a program storage area of a microcomputer and are integrated with the microcomputer into one chip to function as a so-called microcomputer with built-in EEPROM.

A redundancy control circuit 7 detects a system reset signal SYSRES of a microcomputer or a power-on reset signal POR from a voltage detection circuit built in the microcomputer and outputs various control signals described below. Also, numeral 8 denotes a system reset circuit for setting the microcomputer in a standby state according to a redundancy busy signal RDNBSY outputted by the redundancy control circuit 7. Numeral 9 denotes a ring oscillator for generating a clock used in readout of redundancy address data.

Numeral 10 denotes a redundancy address register for temporarily storing the redundancy address data read from the redundancy address memory area 4. The redundancy address register comprises, for example, a latch circuit of 8 bits. Numeral 11 denotes an address matching detection circuit for comparing a value of the redundancy address register with input address data X11–X3 (address data inputted from an external terminal or address data outputted from a CPU) and detecting a match between both the value and the data.

Also, numeral 12 denotes an address control circuit for switching to address space allocated to the redundancy address memory area 4 when an output of the address matching detection circuit 11 and input address data X2–X0 and Y7–Y0 are inputted and redundancy address data matches with input address data X11–X3.

Figure 3:
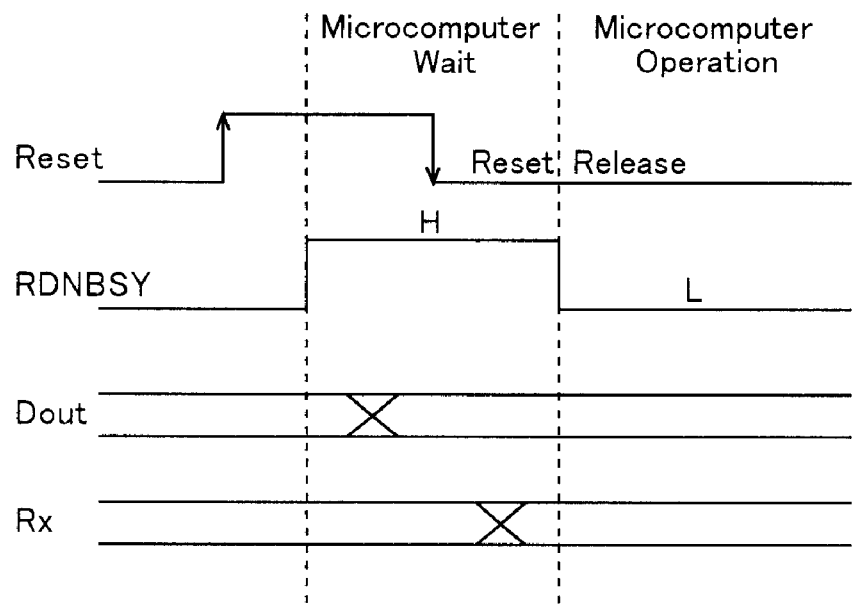
FIG. 3 is an operational timing chart of the redundancy memory circuit according to the embodiment of the invention.
Figure 4:
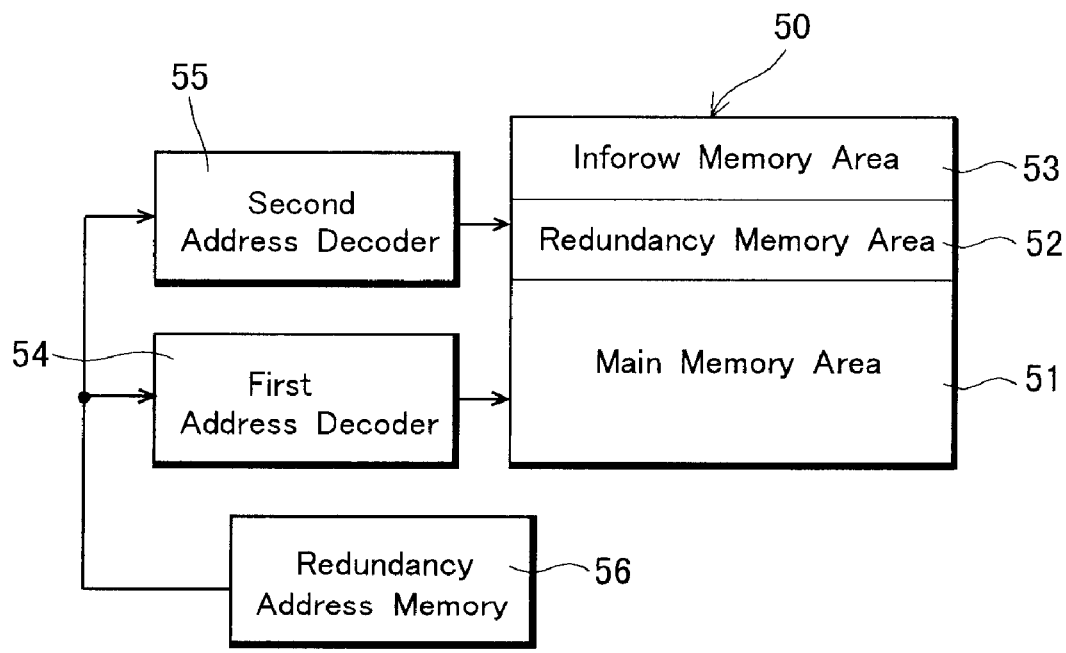
FIG. 4 is a block circuit diagram showing a redundancy memory circuit according to a conventional example.

Next, operations of the redundancy memory circuit with the configuration mentioned above will be described with reference to FIG. 2 and an operational timing chart shown in FIG. 3. First, writing operations of address data into the redundancy address memory area 4 will be described. In the case of measuring a wafer performed after LSI equipped with a redundancy memory circuit is made through a semiconductor manufacturing process, a basic test of memory is conducted by an LSI tester and redundancy address data corresponding to defective sectors of the main memory area 2 is stored in the LSI tester.

At the time of this test mode, the inforow memory area 5 is set in an enabled state. Then, when the defective sectors are within 4 sectors, the LSI tester writes address data of the defective sectors into the redundancy address memory area 4 provided in the inforow memory area 5 through an external terminal of an LSI chip.

Incidentally, the redundancy address memory area 4 is constructed accessibly only at the time of the test mode and is constructed so that a user cannot write and read. Also, it is constructed so that information stored in the inforow memory area 5 cannot be erased by the user.

Next, readout operations of redundancy address data will be described. The redundancy control circuit 7 outputs "H" of a redundancy busy signal RDNBSY when detecting a system reset signal SYSRES of a microcomputer or a power-on reset signal POR. The system reset circuit 8 sets the microcomputer in a wait state according to "H" of this redundancy busy signal RDNBSY. Also, the redundancy control circuit 7 outputs a control signal REN to the ring oscillator 9, and the ring oscillator 9 generates a clock CK used in readout of the redundancy address data.

Further, the redundancy control circuit 7 outputs a redundancy control signal to the redundancy address memory area 4 and accordingly, redundancy address data D07–0 is automatically read from the redundancy address memory area 4. Then, the redundancy control circuit 7 provides a register control signal (latch signal) for the redundancy address register 10. The redundancy address data D07–0 read from the redundancy address memory area 4 is latched by the redundancy address register 10, and is temporarily stored in the redundancy address register 10.

Thereafter, the redundancy control circuit 7 outputs "L" of the RDNBSY as an operation enable signal. As a result of this, the microcomputer becomes an operation enabled state. When a reset of the microcomputer is released, a value of the redundancy address register 10 is compared with address data X11–X3 inputted for accessing memory by the address matching detection circuit 11 and if a match between both the value and the data is obtained, switching to address space allocated to the redundancy address memory area 4 is performed and defective sectors are repaired by the address control circuit 12.

In accordance with the redundancy memory circuit of the invention described above, the redundancy address memory area 4 is formed within the same memory mat as the main memory area 2, so that the need to provide a dedicated analog control circuit as a conventional example is eliminated and a chip size can be reduced considerably.

Also, a size of the redundancy address memory area 4 can be changed easily, so that memory design according to specifications of a type of machine can be performed in a short time while the chip size can be reduced. For example, when the redundancy memory area 3 or the redundancy address memory area 4 is expanded or reduced, expansion or reduction may be performed in sector units, so that a change in a layout is made easily.

Also, a system reset signal SYSRES or a power-on reset signal is used as a trigger signal of readout of redundancy address data, so that synchronization with operations of the microcomputer can be ensured easily.

Incidentally, in the embodiment, the description has been made taking the microcomputer with built-in EEPROM as an example, but the invention is not limited to this and can widely be applied to an EEPROM unit, a system with built-in EEPROM.

As described above, in accordance with a redundancy memory circuit of the invention, a redundancy address memory area is formed within the same memory mat as a main memory area, so that the need to dedicatedly provide a dedicated EEPROM cell for storing redundancy address data and an analog control circuit for writing the redundancy address data into this EEPROM cell is eliminated and a chip size can be reduced.

Also, a size of the redundancy address memory area can be changed easily, so that memory design according to specifications of a type of machine can be performed in a short time while the chip size can be reduced.

Further, when a redundancy memory circuit of the invention is built in a microcomputer as a circuit IP to become system LSI, synchronization with system operations can be obtained surely.

What is claimed is:

1. A redundancy memory circuit comprising:

a main memory area including nonvolatile memories capable of electrically writing and reading, and the main memory area is provided in a memory mat;

a writing unit for writing redundancy address data corresponding to a defective memory area occurring in the main memory area into a redundancy address memory area provided within the same memory mat as the main memory area; and a reading unit for reading the redundancy address data according to a trigger signal;

wherein the defective memory area is repaired on the basis of the redundancy address data read from the redundancy address memory area.

2. A redundancy memory circuit comprising:

a main memory area including nonvolatile memories capable of electrically writing and reading, and the main memory area is provided in a memory mat;

a redundancy address memory area which is provided within the same memory mat as the main memory area and stores redundancy address data corresponding to a defective memory area occurring in the main memory area;

a redundancy memory area which is provided within the same memory mat as the main memory area and replaces the defective memory area;

a redundancy control circuit for outputting a control signal for reading the redundancy address data stored in the redundancy address memory area according to a trigger signal;

an address comparison circuit for comparing the redundancy address data read according to the control signal with input address data inputted for accessing the main memory; and an address control circuit for switching the input address data to address data corresponding to the redundancy address memory area when the redundancy address data matches with the input address data.

3. A redundancy memory circuit according to claim 2, wherein the redundancy memory area is provided in the same address space as the main memory area.

4. A redundancy memory circuit according to claim 2, wherein the redundancy control circuit detects a reset of a microcomputer and outputs a control signal for reading redundancy address data stored in the redundancy address memory area.

5. A redundancy memory circuit according to claim 4, wherein the redundancy control circuit outputs a redundancy busy signal for detecting a reset of a microcomputer to set the microcomputer in a standby state and outputs an operation enable signal for setting the microcomputer in an operating state after reading redundancy address data stored in the redundancy address memory area.

* * * * *